US009215793B2

(12) United States Patent
Sekowski

(10) Patent No.: US 9,215,793 B2
(45) Date of Patent: Dec. 15, 2015

(54) SYSTEM AND METHOD FOR CONNECTING LED DEVICES

(71) Applicant: ABL IP Holding LLC, Conyers, GA (US)

(72) Inventor: Daniel Vincent Sekowski, Loganville, GA (US)

(73) Assignee: ABL IP Holding LLC, Conyers, GA (US)

( * ) Notice: Subject to any disclaimer, the term of this patent is extended or adjusted under 35 U.S.C. 154(b) by 8 days.

(21) Appl. No.: 14/075,748

(22) Filed: Nov. 8, 2013

(65) Prior Publication Data

US 2015/0129910 A1   May 14, 2015

(51) Int. Cl.
*H01L 29/205* (2006.01)
*H01L 33/00* (2010.01)
*H05K 1/00* (2006.01)
*H01L 23/40* (2006.01)

(52) U.S. Cl.
CPC ............ *H05K 1/00* (2013.01); *H01L 2023/405* (2013.01); *H05K 2201/10106* (2013.01)

(58) Field of Classification Search
CPC ............... H01L 2924/01079; H01L 33/62; H01L 2924/14; H01L 33/486; H01L 2924/01078; H01L 33/38; H01L 33/20; H01L 27/153; H01L 2224/48091; H01L 2224/48247
USPC ............ 257/91, 79, 88, 99, 676, 723; 438/25, 438/106, 26
See application file for complete search history.

(56) References Cited

U.S. PATENT DOCUMENTS

| 5,722,760 | A | 3/1998 | Chien |
| 6,229,201 | B1 | 5/2001 | Schwab |
| 6,455,354 | B1 | 9/2002 | Jiang |
| 7,180,099 | B2 | 2/2007 | Ogihara et al. |
| 7,205,648 | B2 | 4/2007 | Shei et al. |
| 7,543,961 | B2 | 6/2009 | Arik et al. |
| 7,588,359 | B2 | 9/2009 | Coushaine et al. |
| 7,946,732 | B2 | 5/2011 | Luo et al. |
| 8,143,713 | B2 | 3/2012 | Song et al. |
| 8,152,347 | B2 | 4/2012 | Brukilacchio |
| 2007/0029674 | A1 | 2/2007 | Shin et al. |
| 2009/0073700 | A1 | 3/2009 | Cruickshank |
| 2010/0096977 | A1* | 4/2010 | Lee et al. ............ 313/503 |
| 2010/0110660 | A1 | 5/2010 | Brukilacchio |
| 2011/0090691 | A1* | 4/2011 | Markle et al. ......... 362/249.02 |
| 2011/0156072 | A1* | 6/2011 | Ling .................... 257/98 |
| 2011/0210664 | A1 | 9/2011 | Hisayasu et al. |
| 2012/0049737 | A1 | 3/2012 | Kitagawa et al. |
| 2012/0127741 | A1 | 5/2012 | Osada et al. |
| 2013/0077326 | A1* | 3/2013 | Zantout et al. ........... 362/396 |
| 2013/0294109 | A1* | 11/2013 | Athalye ................ 362/650 |

FOREIGN PATENT DOCUMENTS

EP   2400818   12/2011

* cited by examiner

*Primary Examiner* — Thao X Le
*Assistant Examiner* — Nduka Ojeh
(74) *Attorney, Agent, or Firm* — Kilpatrick Townsend & Stockton, LLP

(57) ABSTRACT

To connect multiple LED devices, each LED device is placed in a holder. A first wire is connected to a first wire connection point on the holder and a second wire is connected to a second wire connection point on the holder. The first wire is also connected to a first wire connection point on a circuit board. The second wire is also connected to a second wire connection point on the circuit board. A connector may be used to connect the wires to the wire connection points on the circuit board. The circuit board includes traces to connect the LED devices to each other or to other components.

16 Claims, 5 Drawing Sheets

SYSTEM AND METHOD FOR CONNECTING LED DEVICES

FIELD OF THE INVENTION

The present invention is related to connecting LED devices and more particularly to connecting chip on board LED devices and discrete LED devices using a holder and a circuit board.

BACKGROUND

The use of LEDs in all types of lighting fixtures is increasing. In some instances discrete LEDs are used, but in other instances chip on board (COB) LEDs are used. A COB LED includes multiple LEDs packaged as a single device.

In a lighting fixture that uses multiple COB LEDs or multiple clusters of discrete LEDs, the devices may be connected using wire so that one COB LED or one LED cluster is at one end of a wire and another COB LED or another LED cluster is at the other end of the wire. However, it may be difficult to manage the wiring between the COB LEDs or the LED clusters, resulting in high rework and field replacement issues.

In some instances a COB LED may be placed in a COB holder and the COB LEDs may be connected by connecting their respective holders. However, the use of COB holders does not eliminate the wiring issues between the COB LEDs.

It would be advantageous to be able to connect COB LEDs and clusters of LEDs to one another to address the wiring issues between the COB LEDs and the LED clusters.

SUMMARY

One aspect of the invention includes a system for connecting multiple LED devices. An LED device may be a COB LED or may be a cluster of discrete LEDs. Each COB LED or LED cluster is placed in a holder, such as a COB holder. The holder includes two wire connection points. A first wire is connected to a first wire connection point on the holder and a second wire is connected to a second wire connection point on the holder. The first wire is also connected to a first wire connection point on a circuit board The second wire is also connected to a second wire connection point on the circuit board. The wire connection points on the circuit board may include a connector, such as a connector with a release mechanism so that the connections of the wires to the circuit board may be solderless.

The circuit board includes an opening that is large enough to allow the LED device to contact a heat sink. An insulator may be located between the circuit board and the heat sink and also includes an opening. In some implementations, the heat sink includes a riser that extends through the circuit board opening and the insulator opening. If so, then the LED device contacts the riser.

The circuit board may accommodate multiple LED devices. If so, then the circuit board includes an opening for each of the LED devices. The circuit board also includes traces to connect the LED devices to each other and/or to other components. The circuit board traces eliminate the need to use long runs of wire to connect the LED devices to each other.

Other aspects of the invention includes a method for connecting multiple LED devices and a method for replacing an LED device. Other features, advantages, and objects of the present invention will be apparent to those skilled in the art with reference to the remaining text and drawings of this application.

BRIEF DESCRIPTION OF THE FIGURES

These and other features, aspects, and advantages of the present disclosure are better understood when the following Detailed Description is read with reference to the accompanying drawings.

DETAILED DESCRIPTION

The present invention provides a system and methods for connecting multiple LED devices. Briefly described, each LED device is placed in a holder. The holder includes two wire connection points. A first wire is connected to a first wire connection point on the holder and a second wire is connected to a second wire connection point on the holder. The first wire is also connected to a first wire connection point on a circuit board The second wire is also connected to a second wire connection point on the circuit board. The circuit board includes an opening that is large enough to allow the LED device to contact a heat sink. An insulator may be located between the circuit board and the heat sink and also includes an opening. The circuit board may accommodate multiple LED devices. If so, then the circuit board includes traces to connect the LED devices to each other or to other components.

Mounting for an LED Device

Figure 1:
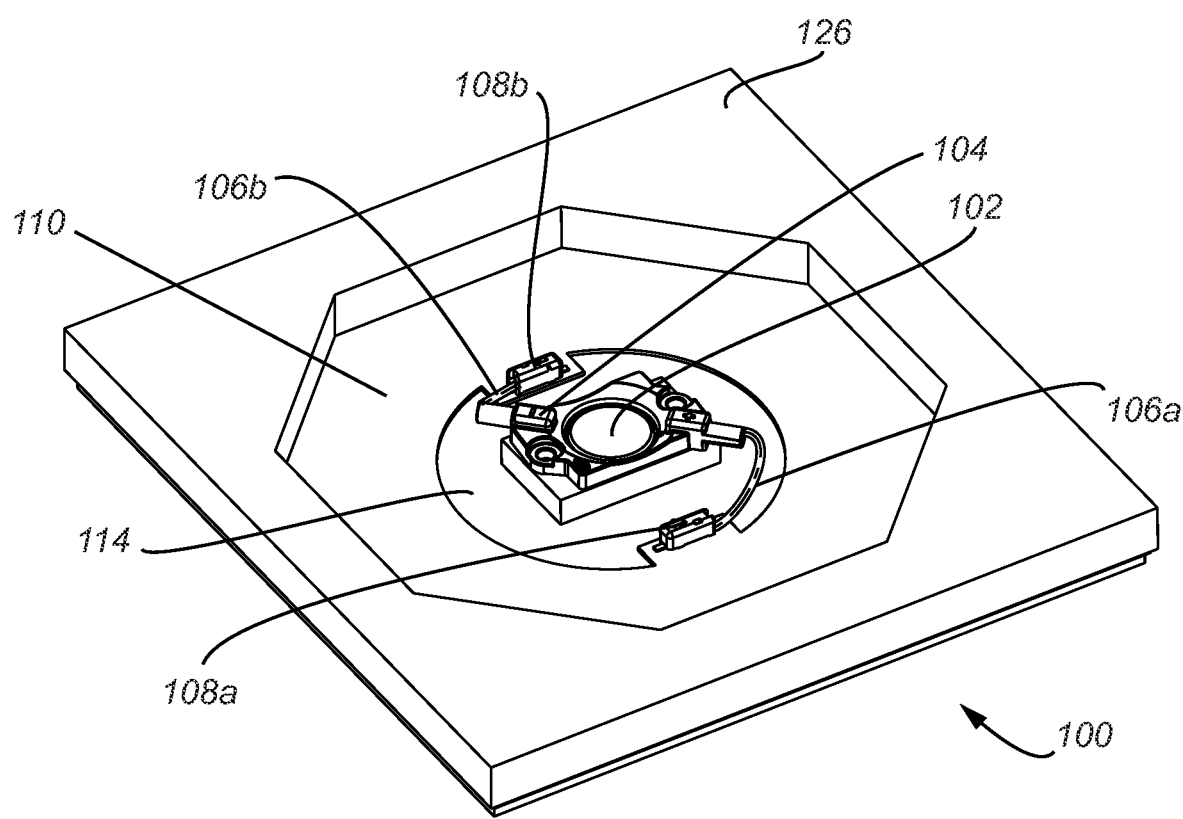
FIG. 1 illustrates an exemplary mounted LED device.

FIG. 1 illustrates an exemplary mounting for an LED device. The LED device shown in FIG. 1 is a COB LED 102 mounted in a COB holder 104. The COB holder includes a first wire connection point and a second wire connection point. A first wire 106a is connected to the first wire connection point of the COB holder and a second wire 106b is connected to the second wire connection point of the COB holder. The first wire 106a is also connected to a first wire connection point of the circuit board 110. In FIG. 1 the first wire connection point of the circuit board includes a connector 108a. The connector may include a release mechanism that releases the wire when activated. One non-limiting example is a button that releases the wire when depressed. The second wire 106b is also connected to a second wire connection point of the circuit board 110, which may also include a connector 108b with a release mechanism.

FIG. 1 also illustrates a heat sink 114. The COB LED is mounted so that it directly contacts the heat sink. As shown in FIG. 1 the circuit board may include an opening to allow the COB LED and at least a portion of the COB holder to contact the heat sink. Although not shown in FIG. 1, there may be an insulator between the circuit board 110 and the heat sink 114. A frame 126 may be positioned over a portion of the circuit board so that is surrounds the mounted COB LED.

Figure 2:
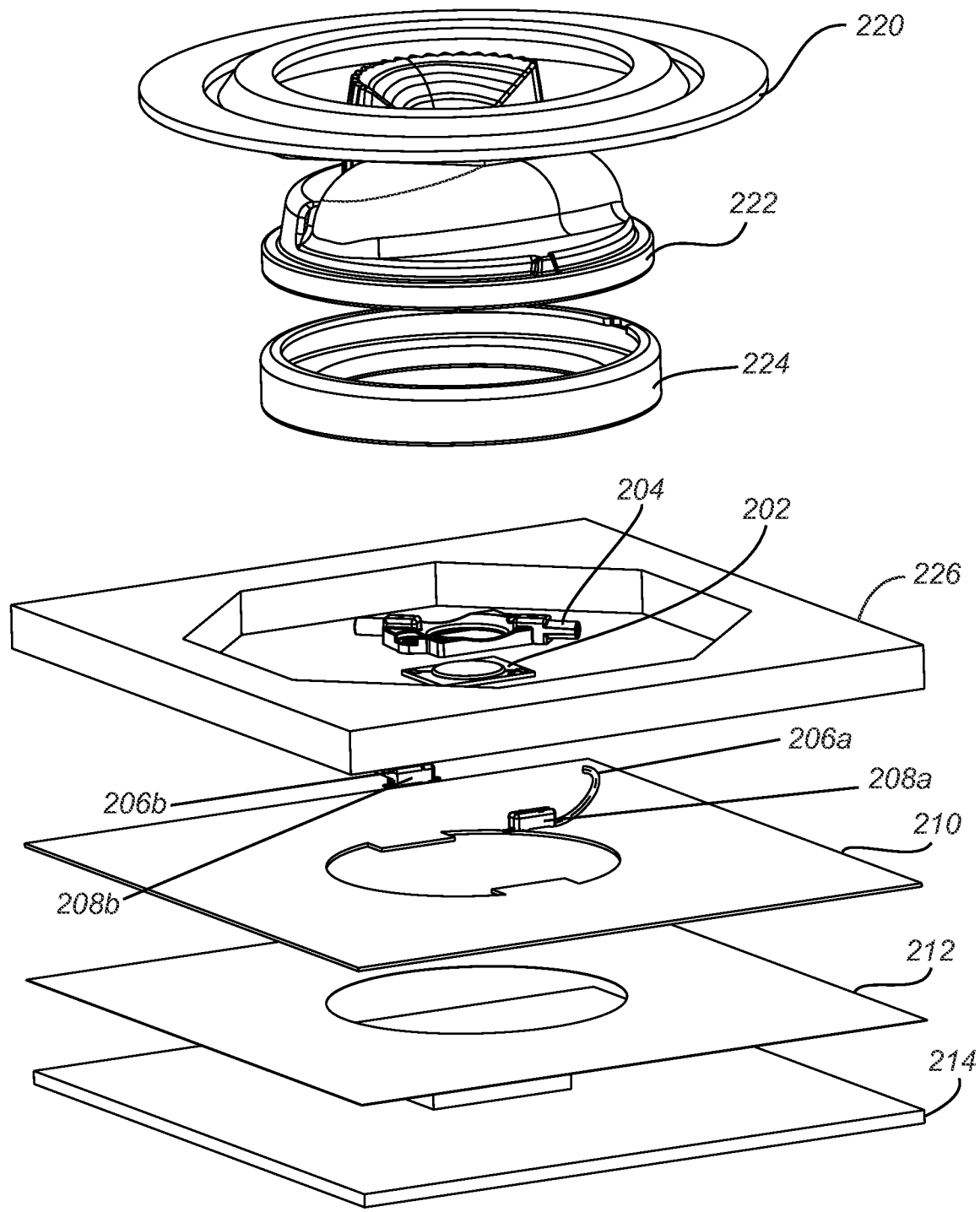
FIG. 2 is an exploded view of FIG. 1, with additional lens components.

FIG. 2 is an exploded view of FIG. 1 with the addition of lens components. In particular, FIG. 2 illustrates the COB LED 202, the COB holder 204, the first wire 206a, the second wire 206b, the connector 208a at the first wire connection point of the circuit board 210, the connector 208b at the second wire connection point of the circuit board 210, and the circuit board 210. FIG. 2 also illustrates the insulator 212 located between the circuit board 210 and the heat sink 214, which was not visible in FIG. 1. The size and shape of the openings in the circuit board and the insulator are similar in FIG. 2 so that the insulator insulates the circuit board from the heat sink.

FIG. 2 also illustrates frame 226 that surrounds the COB LED mounted in the COB holder and covers a portion of the periphery of the circuit board associated with the COB LED. The opening in the frame illustrated in FIG. 2 is larger than the openings in the circuit board and the insulator. A lens 222 fits over a gasket 224 and is held in place by a flange 220. Both the flange 220 and the frame are keyed. The gasket in FIG. 2 has an opening that allows the gasket to fit over the COB LED in the COB holder, the wires, and the connectors. The sizes and shapes of the openings in the gasket, frame, circuit board, and insulator shown in FIG. 2 are exemplary. Other sizes and shapes may also be used. The configuration of the COB holder shown is exemplary. Other types of COB may also be used.

Circuit Board with Multiple LED Devices

Figure 3:
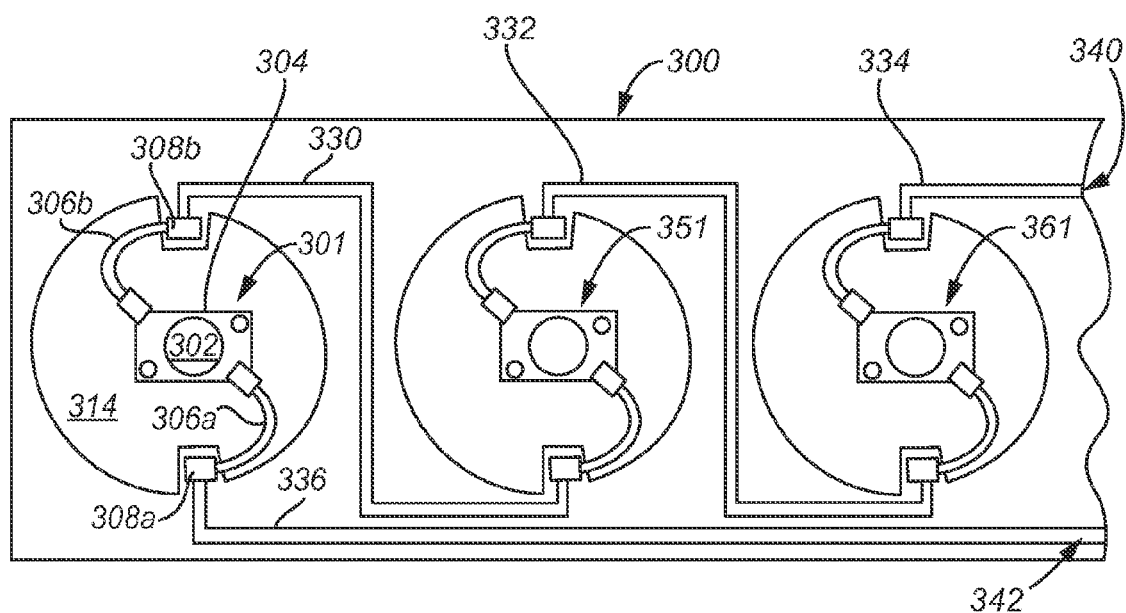
FIG. 3 illustrates an exemplary circuit board with multiple LED devices.

The circuit board shown in FIGS. 1 and 2 may be a portion of a larger circuit board used to connect multiple LED devices. FIG. 3 illustrates three LED devices mounted on an exemplary circuit board 300 and the traces on the circuit board that connect the devices. The LED devices in FIG. 3 are connected in series. The LED devices are powered through a first power connection point 340 and a second power connection point 342. A first trace 334 connects the first power connection point to a mounted LED device 361, a second trace 332 connects the mounted LED device 361 to another mounted LED device 351, a third trace connects the mounted LED device 351 to yet another mounted LED device 301, and a fourth trace 336 connects the mounted LED device 301 to the second power connection point 342.

The traces that connect the mounted LED devices may electrically connect the first wire connection point of the portion of the circuit board for one LED device with the second wire connection point of the portion of the circuit board for another LED device. For example, trace 330 connects the first wire connection point of the portion of the circuit board associated with mounted LED device 351 to the second wire connection point of the portion of the circuit board associated with mounted LED device 301. Although FIG. 3 illustrates the serial connection of LED devices, the invention may be used with other designs that configure the LED devices differently.

Figure 4:
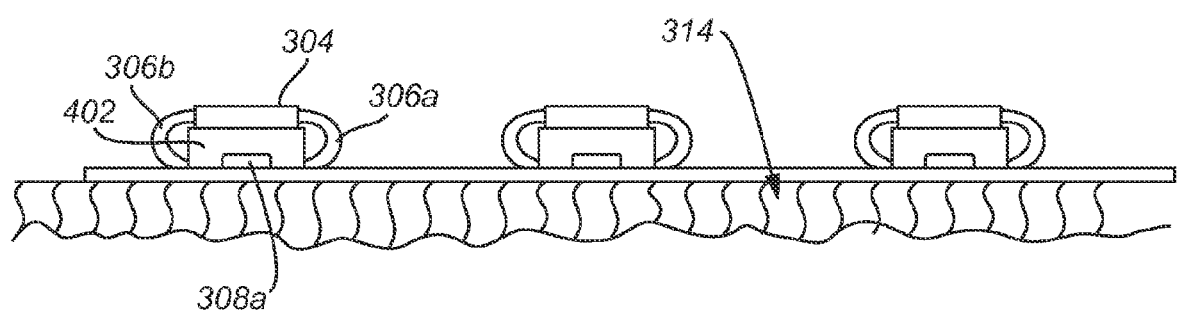
FIG. 4 illustrates a side view of an exemplary circuit board.

FIG. 4 illustrates a side view of the circuit board of FIG. 3 when the heat sink 314 includes a riser for each of the LED devices. The riser 402 extends through the opening of the optional insulator (not shown) and the portion of the circuit board 300 associated with LED device 302. The LED device and the holder are located on the top surface of the riser. In this configuration, the first wire connects to the first wire connection point of the holder on one level and to the first wire connection point of the portion of the circuit board associated with the LED device on another lower level.

The circuit board may be connected to another circuit board or to another component in a lighting fixture. In some implementations, multiple circuit boards having multiple LED devices may be used in the same lighting fixture.

Method for Connecting LED Devices

Figure 5:
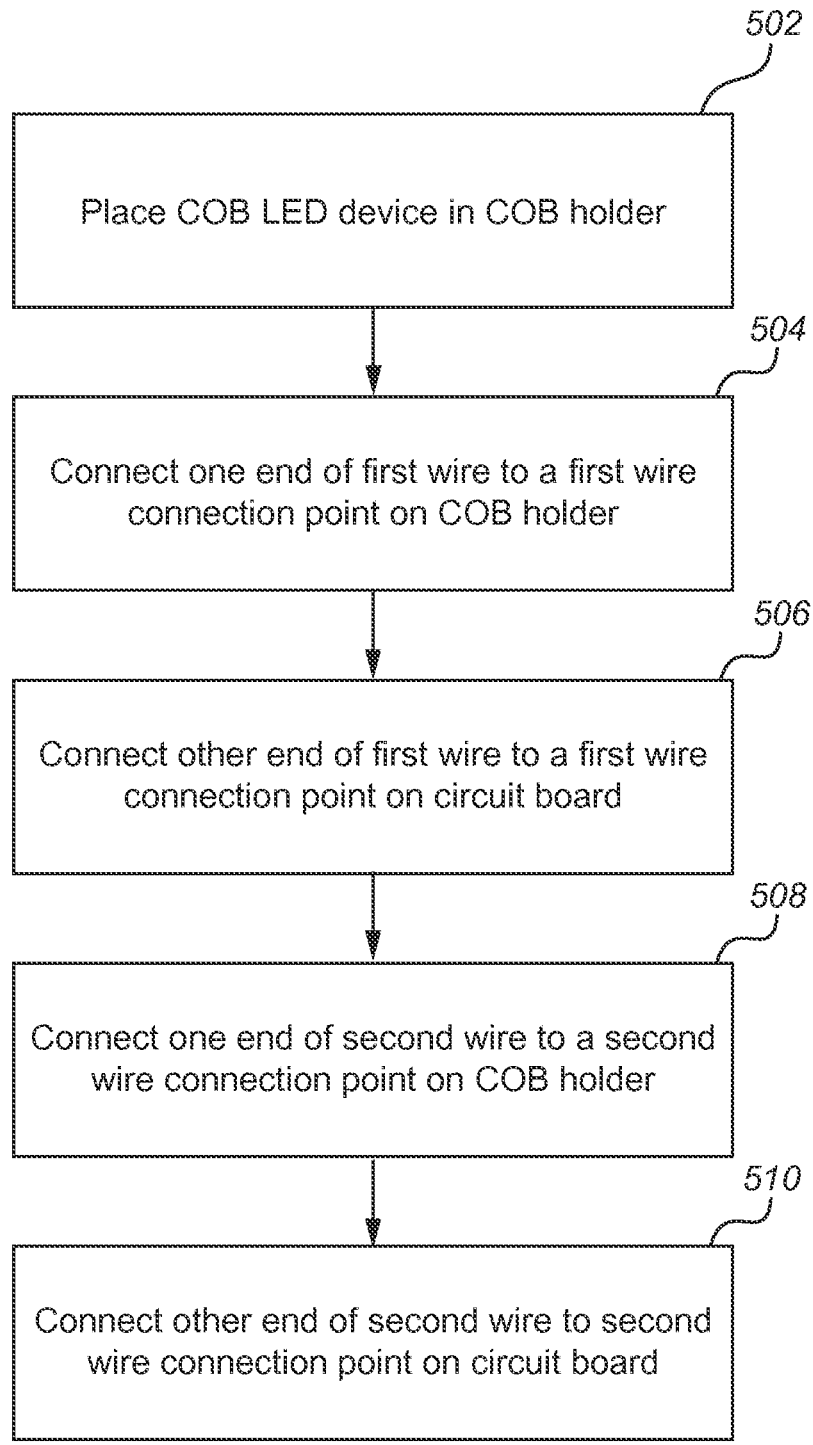
FIG. 5 illustrates an exemplary method for mounting a LED device to a circuit board.

FIG. 5 illustrates a method for connecting multiple COB LEDs. At 502 a COB LED is placed in a COB holder. A first end of a first wire is connected to the first wire connection point on the COB holder at 504 and a second end of the first wire is connected to the first wire connection point on the circuit board at 506. A first end of a second wire is connected to the second wire connection point on the COB holder at 508 and a second end of the second wire is connected to the second wire connection point on the circuit board at 510. The invention includes connecting the ends of the wires in any order. For example, both ends of the first wire may be connected before the ends of the second wire or alternatively, one end of the first wire may be connected, then one end of the second wire.

The process may be repeated as needed until all of the COB LEDs are connected to the circuit board. Repeating the process may include connecting one COB LED to the circuit board, then connecting another COB LED to the board. Alternatively, repeating the process may include repeating one or more of the steps for each of the COB LEDs and then moving on to a different step.

If the wire connection points on the circuit board include a connector with a release mechanism, then a COB LED may be replaced by disconnecting the wires from the connectors by activating the release mechanism, removing the COB LED from the COB holder, placing a new COB LED in the COB holder, and re-connecting the wires to the connectors.

Figure 6:
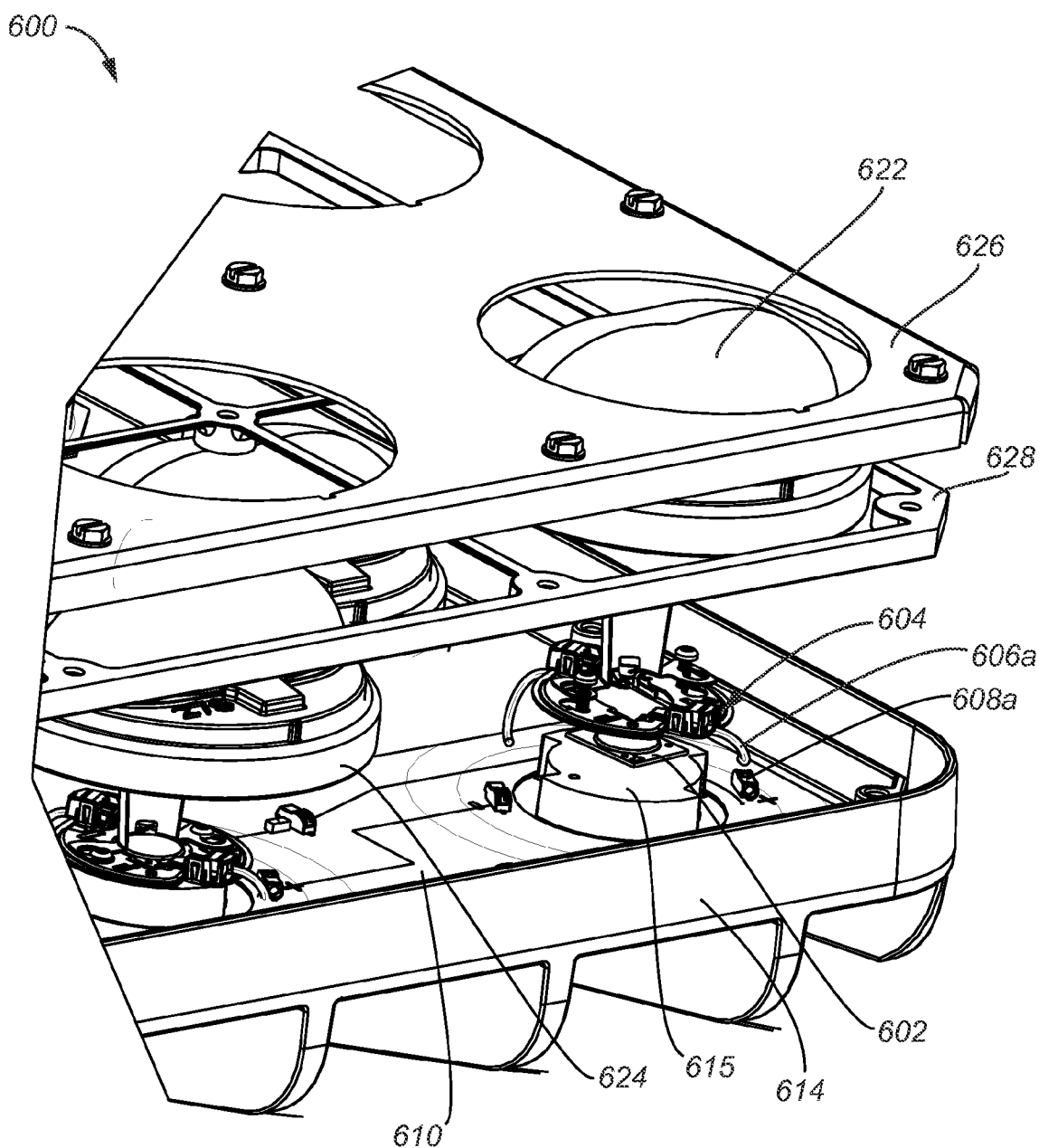
FIG. 6 illustrates an exploded view of an exemplary mounted LED device.

FIG. 6 is an exploded view of an exemplary design for mounting multiple COB LEDs in a single housing 600. FIG. 6 illustrates a COB LED 602, a COB holder 604, the first wire 606a, the second wire, the connector 608a at the first wire connection point of the circuit board 610, the connector at the second wire connection point of the circuit board 610, the circuit board 610, and the heat sink 614. The heat sink includes a riser or elevated platform 615. Although not shown in FIG. 6, there may be an insulator located between the circuit board 610 and the heat sink 614. The size and shape of the openings in the circuit board and the insulator are similar so that the insulator insulates the circuit board from the heat sink.

FIG. 6 also illustrates a plate gasket 628, gasket 624 for each COB LED, lens 622 for each COB LED, and a hold down plate 626. The plate gasket may have openings for each of the gaskets 624 and the lenses 622. The lenses 622 and gaskets 624 may be held in place by the connection of the hold down plate 626 to the plate gasket 628 and the heat sink 614. The hold down plate 626 and the plate gasket 628 may be attached to attachment points provided on the heat sink using any type of fastener. For example, FIG. 6 illustrates that a threaded faster is inserted through the hold down plate 626 and the plate gasket 628 and into an opening in the heat sink 614, such as the one shown in the corner of the heat sink. The sizes and shapes of the openings in the plate gasket, hold down plate and circuit board shown in FIG. 6 are exemplary. Other sizes and shapes may also be used. The configuration of the COB holder shown is also exemplary. Other types of COB holders may also be used.

The foregoing is provided for purposes of illustrating, explaining, and describing embodiments of the present invention. Further modifications and adaptations to these embodiments will be apparent to those skilled in the art and may be made without departing from the scope or spirit of the invention. Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. For example, although some of the examples describe that the LED device is a COB LED, the LED device may also be a cluster of discrete LEDs. If a cluster of LEDs is used, then the design of the holder may differ from that shown in the figures. In addition, although the invention is applicable to a lighting fixture, the invention may also be used in other types of devices that use LEDs. The interconnections and traces shown are exemplary and other arrangements and connections may be used as appropriate. Accordingly, the present invention is not limited to the embodiments described above or depicted in the drawings, and various embodiments and modifications can be made without departing from the scope of the invention.

What is claimed is:

1. A mounted LED device, comprising:
   the LED device releasably mounted in a holder, wherein the holder includes a first wire connection point and a second wire connection point;
   a first wire, wherein a first end of the first wire is connected to the first wire connection point on the holder and a second end of the first wire is connected to a first wire connection point on a circuit board;
   a second wire, wherein a first end of the second wire is connected to the second wire connection point on the holder and a second end of the second wire is connected to a second wire connection point on the circuit board;
   the circuit board, wherein the first wire connection point on the circuit board is electrically connected to a first trace on the circuit board and the second wire connection point on the circuit board is electrically connected to a second trace on the circuit board and wherein the circuit board includes an opening;
   an insulator having an opening;
   a heat sink having a formed riser, wherein the riser extends through the opening in the insulator and further extends through the opening in the circuit board so that a height of the riser exceeds an upper surface of the circuit board;
   a removable lens; and
   a gasket having an opening;
   wherein the insulator is between the circuit board and the heat sink;
   wherein the LED device and the holder directly contact the formed riser of the heat sink, and wherein the formed riser positions the LED device and holder beyond the upper surface of the circuit board, and
   wherein the removable lens fits the opening of the gasket and covers the LED device, the holder, the first wire, the second wire, and the formed riser of the heat sink.

2. The mounted LED device of claim 1, wherein the first trace connects the first wire connection point on the circuit board to a second wire connection point associated with a different LED device.

3. The mounted LED device of claim 1, wherein the second trace connects the second wire connection point on the circuit board to a first wire connection point associated with a different LED device.

4. The mounted LED device of claim 1, wherein the first wire connection point on the circuit board includes a first connector with a release mechanism capable of releasing the first wire from the first connector.

5. The mounted LED device of claim 1, wherein the first wire connection point of the holder is on one level and the first wire connection point of the circuit board is on a different level.

6. The mounted LED device of claim 1, wherein the LED device comprises a COB (chip on board) LED or a plurality of discrete LEDs.

7. A method for attaching an LED device to a circuit board, comprising:
   placing the LED device in a holder, wherein the LED device may be released from the holder;
   connecting a first end of a first wire to a first wire connection point on the holder;
   connecting a first end of a second wire to a second wire connection point on the holder;
   connecting a second end of the first wire to a first wire connection point on a circuit board;
   connecting a second end of the second wire to a second wire connection point on the circuit board; and
   placing a removable lens over a gasket having an opening, the LED device, the holder, the first wire, the second wire and a formed riser of a heat sink;
   wherein the circuit board has an opening to allow the riser on the heat sink to contact the LED device, and an insulator with an opening large enough to admit the riser is between the circuit board and the heat sink,
   wherein the riser extends through the opening in the insulator and further extends through the opening in the circuit board so that a height of the riser exceeds an upper surface of the circuit board,
   wherein the LED device and the holder directly contact the formed riser of the heat sink, and wherein the formed riser positions the LED device and holder beyond the upper surface of the circuit board, and
   wherein the first wire connection point on the circuit board electrically connects the LED device to a second LED device via a first trace.

8. The method of claim 7, wherein connecting a second end of the first wire to a first wire connection point on a circuit board comprises connecting the second end of the first wire to a first connector mounted on the circuit board.

9. The method of claim 7, wherein the second wire connection point on the circuit board electrically connects the LED device to a third LED device via a second trace.

10. The method of claim 7, further comprising:
    replacing the LED device by:
       removing the lens;
       disconnecting the first wire from the first connection point of the holder or the first connection point of the circuit board;
       disconnecting the second wire from the second connection point of the holder or the second connection point of the circuit board;
       removing the LED device from the holder;
       placing a replacement LED device into the holder;
       reconnecting the first wire;
       reconnecting the second wire; and
       repositioning the lens over the gasket to cover the replacement LED device, the holder, the first wire, the second wire, and the riser of the heat sink.

11. A system for connecting a plurality of LED devices, comprising: a circuit board, a plate gasket having a plurality of openings, and for each of the LED devices: a holder for releasably holding the LED device, wherein the holder includes a first wire connection point and a second wire connection point; a first wire, wherein a first end of the first wire is connected to the first wire connection point on the holder and a second end of the first wire is connected to a first wire connection point on the circuit board; a second wire, wherein a first end of the second wire is connected to the second wire connection point on the holder and a second end of the second wire is connected to a second wire connection point on the circuit board; a heat sink having a formed riser; and a removable lens, wherein the lens covers the LED device, the holder, the formed riser, the first wire, and the second wire, and wherein the lens fits a particular opening in the plate gasket; wherein the LED device and the holder directly contact the formed riser of the heat sink, wherein the formed riser positions the LED device and holder beyond the upper surface of the circuit board, wherein the first wire connection point on the circuit board associated with a first one of the LED devices is electrically connected to a first trace on the circuit board and the second wire connection point on the circuit board associated with the first one of the LED devices is electrically connected to a second trace on the circuit board, wherein the second trace electrically connects a first power connection point to the second wire connection point on the circuit board associated with the first one of the LED devices, the first trace electrically connects the first wire connection point on the circuit board associated with the first one of the LED devices with a second wire connection point of a second one of the LED devices, and wherein a last trace electrically connects a second power connection point to the first wire connection point on the circuit board associated with a last one of the LED devices.

12. The system of claim 11, wherein the LED devices are connected in series.

13. The system of claim 11, further comprising:
an insulator having an opening for each of the LED devices and its respective holder,
wherein the circuit board includes an opening for each of the LED devices and its respective holder, the insulator is between the circuit board and each heat sink and the openings in the insulator and the openings in the circuit board being formed and aligned to allow each of the LED devices and its respective holder to contact each respective heat sink.

14. The system of claim 13, further comprising:
for each of the LED devices:
the first wire connection point on the circuit board includes a first connector with a release mechanism capable of releasing the first wire.

15. The system of claim 11, wherein the first wire connection point of the holder for the first one of the LED devices is on one level and the first wire connection point on the circuit board associated with the first one of the LED devices is on a different level.

16. The system of claim 11, wherein each of the LED devices comprises a COB (chip on board) LED or a plurality of discrete LEDs.

* * * * *